(12) United States Patent
Morris et al.

(10) Patent No.: US 9,935,066 B2
(45) Date of Patent: Apr. 3, 2018

(54) SEMICONDUCTOR PACKAGE HAVING A SUBSTRATE STRUCTURE WITH SELECTIVE SURFACE FINISHES

(71) Applicant: Qorvo US, Inc., Greensboro, NC (US)

(72) Inventors: Thomas Scott Morris, Lewisville, NC (US); Robert Hartmann, Apopka, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/224,977

(22) Filed: Aug. 1, 2016

(65) Prior Publication Data

US 2017/0040273 A1 Feb. 9, 2017

Related U.S. Application Data

(60) Provisional application No. 62/201,855, filed on Aug. 6, 2015.

(51) Int. Cl.
| | |
|---|---|
| *H01L 27/00* | (2006.01) |
| *H01L 23/00* | (2006.01) |
| *H01L 23/498* | (2006.01) |
| *H01L 23/31* | (2006.01) |

(52) U.S. Cl.
CPC .......... *H01L 24/05* (2013.01); *H01L 23/3157* (2013.01); *H01L 23/49838* (2013.01); *H01L 24/03* (2013.01); *H01L 24/45* (2013.01); *H01L 2224/03828* (2013.01); *H01L 2224/04042* (2013.01); *H01L 2224/05644* (2013.01); *H01L 2224/05655* (2013.01); *H01L 2224/05664* (2013.01); *H01L 2224/16225* (2013.01); *H01L 2924/181* (2013.01); *H01L 2924/19107* (2013.01)

(58) Field of Classification Search
CPC ....................................................... H01L 24/05
See application file for complete search history.

(56) References Cited

U.S. PATENT DOCUMENTS

| | | | |
|---|---|---|---|
| 2014/0231127 A1* | 8/2014 | Manero | H05K 3/282 174/266 |
| 2014/0346637 A1* | 11/2014 | Komposch | H01L 24/85 257/532 |

* cited by examiner

*Primary Examiner* — William Harriston
(74) *Attorney, Agent, or Firm* — Withrow & Terranova, P.L.L.C.

(57) ABSTRACT

The present disclosure relates to a semiconductor package having a substrate structure with selective surface finishes, and a process for making the same. The disclosed semiconductor package includes a substrate body, a first metal structure having a first finish area and a second finish area, a second metal structure having a third finish area, a surface finish, and a tuning wire. The first metal structure and the second metal structure are formed over the substrate body. The surface finish is provided over the first finish area of the first metal structure and at least a portion of the third finish area of the second metal structure. The surface finish is not provided over the second finish area of the first metal structure. The tuning wire is coupled between the first finish area and at least one portion of the third finish area.

17 Claims, 12 Drawing Sheets

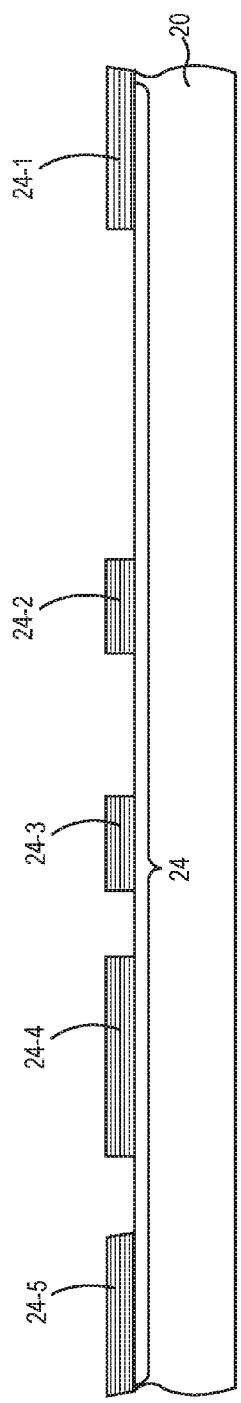
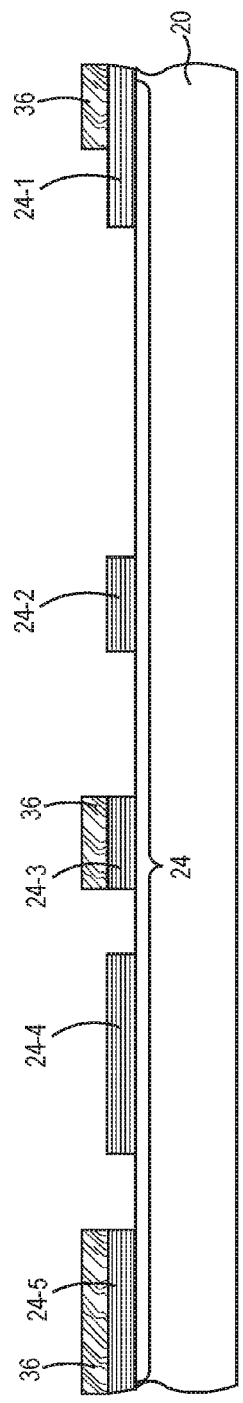
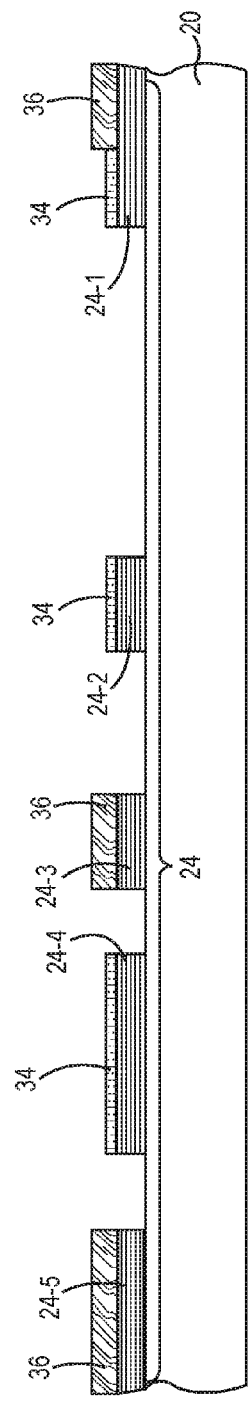
FIG. 4A
FIG. 4B
FIG. 4C

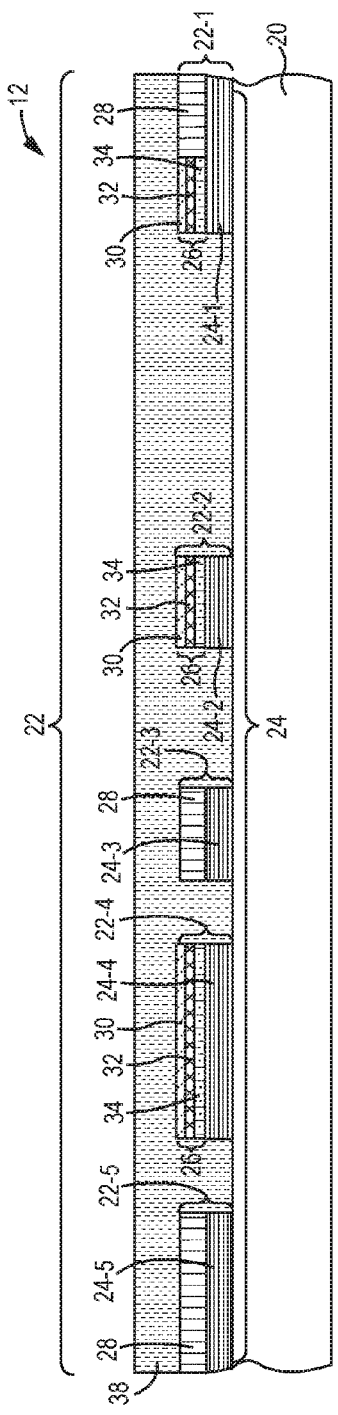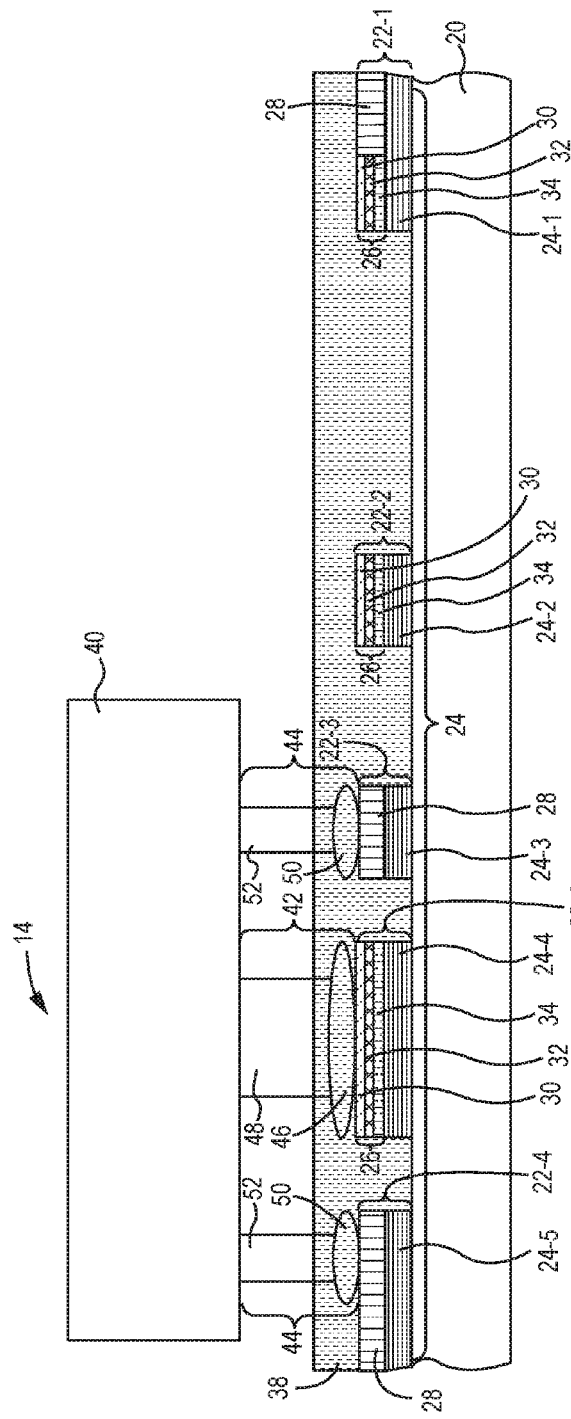

ic package designs to reduce the possibility of the

SEMICONDUCTOR PACKAGE HAVING A SUBSTRATE STRUCTURE WITH SELECTIVE SURFACE FINISHES

RELATED APPLICATIONS

This application claims the benefit of U.S. provisional patent application No. 62/201,855 filed Aug. 6, 2015, the disclosure of which is incorporated herein by reference in its entirety.

FIELD OF THE DISCLOSURE

The present disclosure relates to a semiconductor package and a process for making the same, and more particularly to a semiconductor package having a substrate structure with selective surface finishes, and a process to connect a tuning wire to the substrate structure with selective surface finishes.

BACKGROUND

Hybrid assembly technology, which combines a flip chip assembly and a wire-bonding assembly, is attractive in current semiconductor packaging. The hybrid assembly benefits the short interconnect paths between flip chip dies and a substrate, and utilizes wires to form tuning elements for flip chip dies. With the flip chip dies, the package space needed for wire bonding of dies is eliminated and thus the overall size of the package is reduced. In addition, the wires accompanied with the flip chip dies may be used to form jumpers, inductors, or other features that may be used to improve the performance of the flip chip dies.

In general, a flip chip die has a die body and multiple interconnect structures that are used to attach the flip chip die to the substrate. Each interconnect structure includes a solder and a pillar extending outward from the die body to the solder. In flip chip assembly, reflowing solders of the interconnect structures is one of the process steps used to connect each interconnect structure to a corresponding metal structure on a top surface of the substrate. Due to cost and performance considerations, the pillar of each interconnect structure and the corresponding metal structure are formed of copper. During the reflowing step, the solder of each interconnect structure will turn into a liquid-phase and flow along the most active surface. Since the pillar and the corresponding metal structure are formed from a common material—copper, there is a risk that the liquid phase solder will flow back to the flip chip die along the pillar and short circuits on the flip chip die. To address this issue, a surface finish is applied to the metal structure to increase its surface activity. One possible surface finish formed of gold will effectively pull the liquid-phase solder onto the metal structure and prevent the liquid-phase solder from flowing up the pillar back to the flip chip die.

In addition, in order to get a reliable wire bonding for a tuning wire, the substrate normally requires metal pads with high active surface finishes, which have high wire-bonding pulling strength. One possible surface finish formed of gold will effectively pull ends of the tuning wire onto the metal pads. However, the gold surface finish is expensive, which will raise the cost of the final product.

Accordingly, there remains a need for improved semiconductor package designs to reduce the possibility of the solders flowing back to the flip chip die and achieve the reliable wire bonding for the tuning wire. Further, there is also a need to keep the final product cost effective.

SUMMARY

The present disclosure relates to a semiconductor package having a substrate structure with selective surface finishes, and a process for making the same. The disclosed semiconductor package includes a substrate body, a first finished metal structure having a first metal structure, a second finished metal structure having a second metal structure, and a tuning wire. The first metal structure and the second metal structure are formed over a top surface of the substrate body. The first metal structure has a first finish area that is finished with a first surface finish and a second finish area that is not finished with the first surface finish. The second metal structure has a third finish area and at least one portion of the third finish area is finished with the first surface finish. The tuning wire is coupled between the first finish area and the at least one portion of the third finish area.

According to an exemplary process to fabricate the disclosed semiconductor package, a substrate body with a first metal structure and a second metal structure formed on a top surface of the substrate body are provided initially. The first metal structure has a first finish area and a second finish area, and the second metal structure has a third finish area. Next, a first surface finish is formed over the first finish area and the at least one portion of the third finish area. And a second surface finish is formed over the second finish area to complete a substrate structure with selective surface finishes. Herein, the second surface finish is different from the first surface finish. Finally, a tuning wire is coupled between the first finish area and the at least one portion of the third finish area.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIGS. 4A-4G provide exemplary fabrication steps that illustrate a process to fabricate the exemplary substrate structure shown in FIG. 2B.

FIGS. 6A-6E provide exemplary fabrication steps that illustrate a process to form an exemplary semiconductor package with the exemplary substrate structure shown in FIG. 2B.

Figure 1:
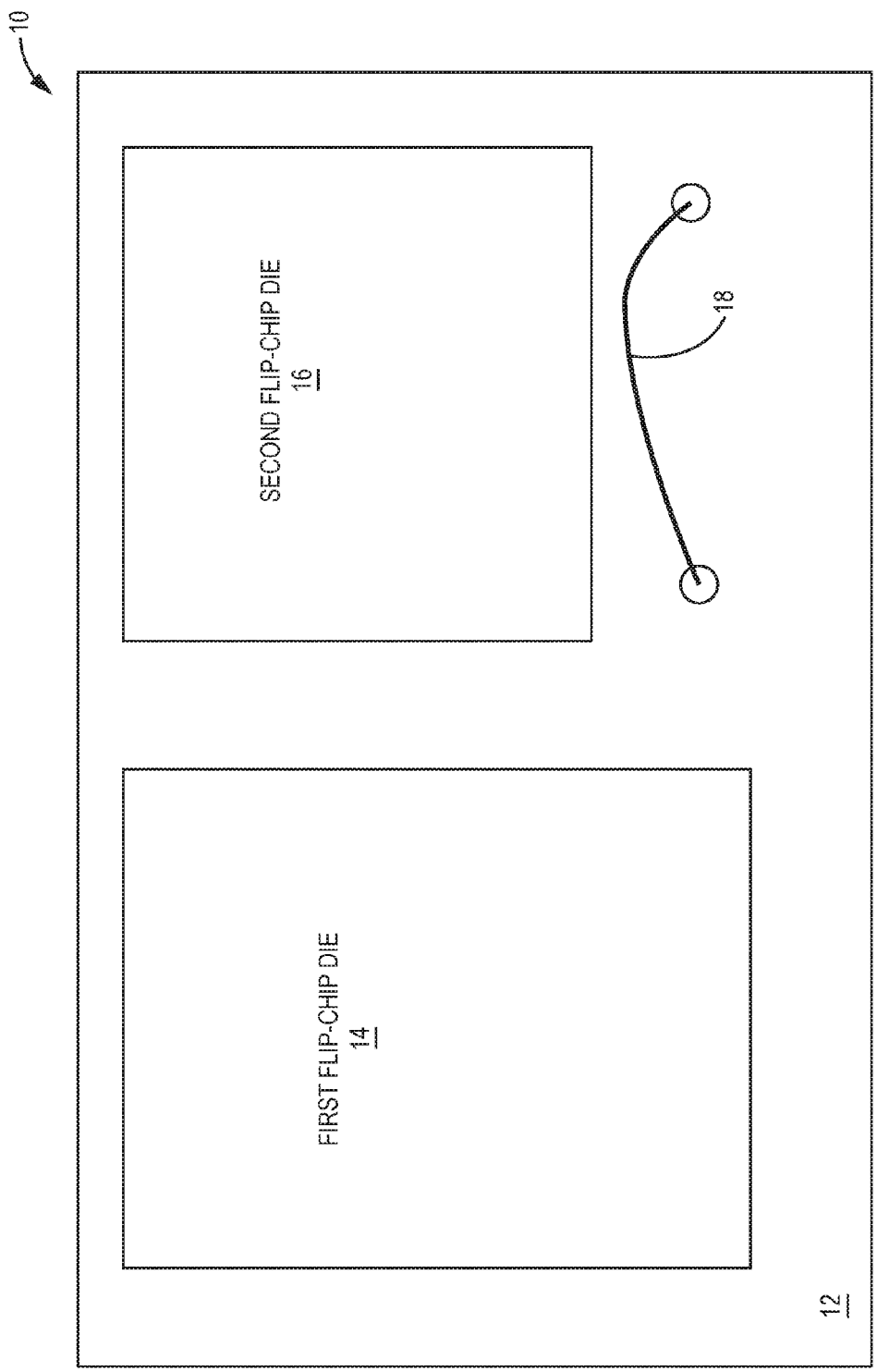
FIG. 1 provides a block diagram that illustrates an exemplary semiconductor package according to one embodiment of the present disclosure.

It will be understood that for clear illustrations, FIGS. 1-6E may not be drawn to scale.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a semiconductor package having a substrate structure with selective surface finishes and a process for making the same. FIG. 1 provides a block diagram that illustrates an exemplary semiconductor package 10 according to one embodiment of the present disclosure. For the purpose of this illustration, the exemplary semiconductor package 10 includes a substrate structure 12, a first flip chip die 14, a second flip chip die 16 and a tuning wire 18. In different applications, the exemplary semiconductor package 10 may include fewer or more flip chip dies and tuning wires. The tuning wire 18 may be used as a tuning element for adjacent flip chip dies, such as jumpers, inductors, or other features that may be used to improve the performance of the adjacent flip chip dies.

Figure 2A:
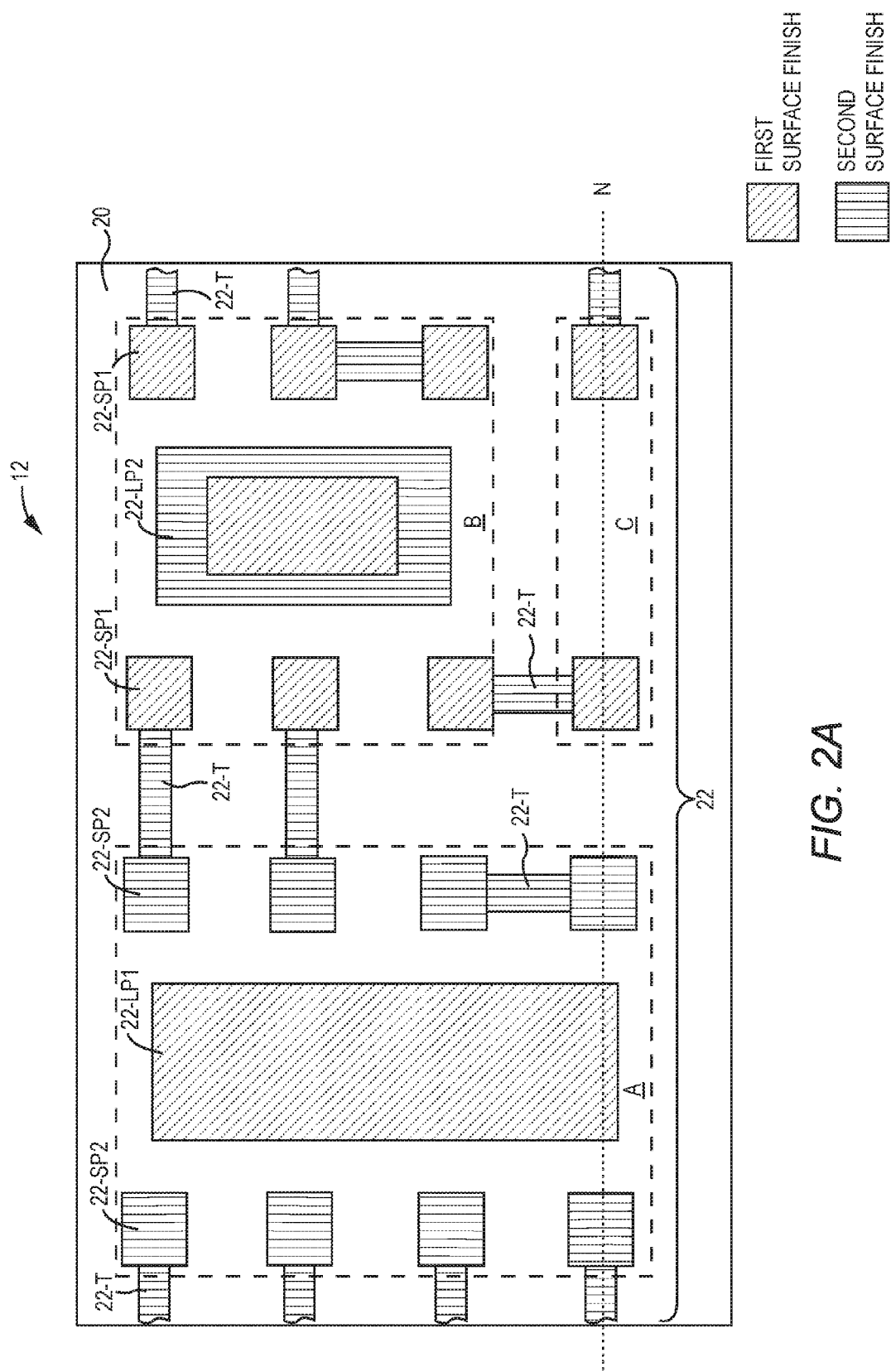
FIGS. 2A-2B provide an exemplary substrate structure with selective surface finishes for the exemplary semiconductor package shown in FIG. 1.

FIG. 2A is a top view of an exemplary substrate structure 12 of the exemplary semiconductor package 10 shown in FIG. 1. The substrate structure 12 includes a substrate body 20 and finished metal structures 22 over a top surface of the substrate body 20. For the purpose of this illustration, the finished metal structures 22 include eight first surface finished small pads 22-SP1, eight second surface finished small pads 22-SP2; one first surface finished large pad 22-LP1, one combined surface finished large pad 22-LP2, and twelve second surface finished traces 22-T (only a few of the pads and traces are labeled with reference numbers to avoid drawing clutter). In different applications, the finished metal structures 22 may include fewer or more small pads/large pads/traces with different surface finishes. Further, the finished metal structures 22 may have different shapes for small pads/large pads/traces. Herein, a section A of the substrate structure 12 is configured to connect the first flip chip die 14, a section B of the substrate structure 12 is configured to connect the second flip chip die 16, and a section C of the substrate structure 12 is configured to connect the tuning wire 18.

Figure 2B:
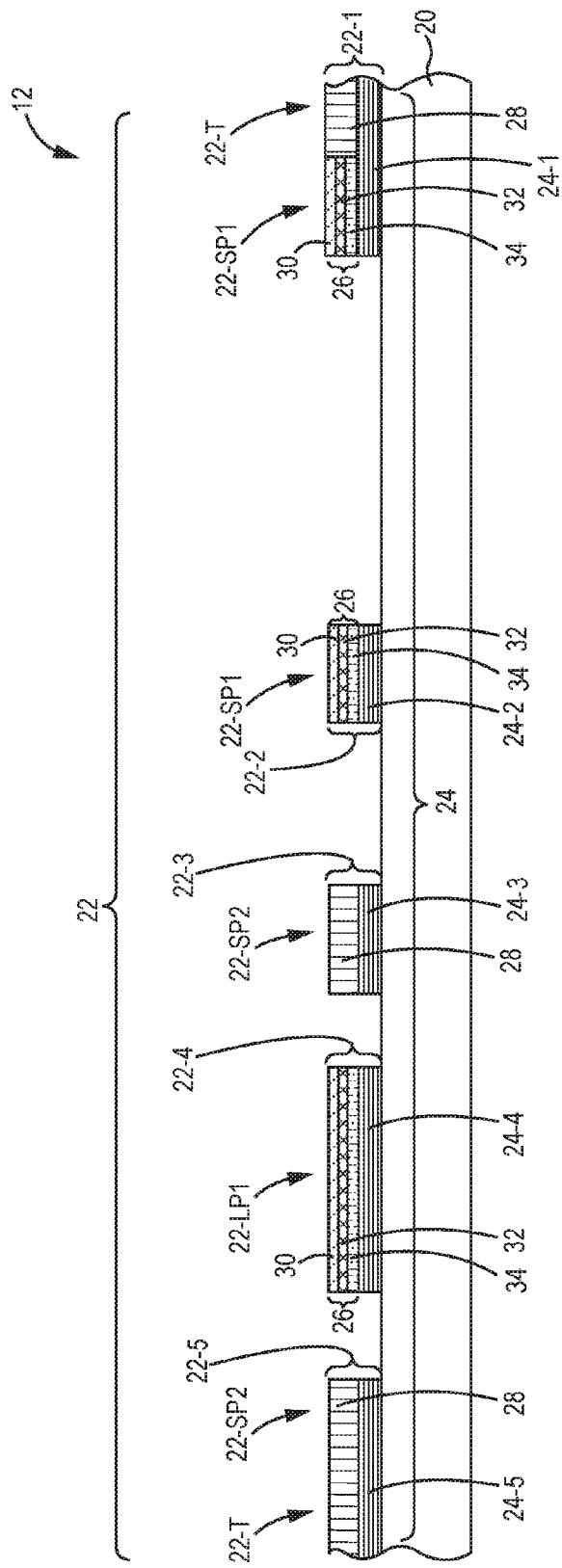

FIG. 2B shows a cross-sectional view of the exemplary substrate structure 12 at the dotted-line N in FIG. 2A. The finished metal structures 22 are formed by metal structures 24 with a first surface finish 26 and a second surface finish 28. The metal structures 24 may be formed of copper, which has a relatively low surface activity. A thickness of the metal structures 24 is between 6 μm and 26 μm. The first surface finish 26 and the second surface finish 28 formed over the metal structures 24 help to increase the surface activity of the finished metal structures 22, and consequently help to pull the liquid-phase solders of dies and or ends of tuning wires onto the finished metal structures 22 in later processes.

In general, the first surface finish 26 is different from the second surface finish 28. By definition, materials are different if they include different elements or have a different element composition. The first surface finish 26 has a higher surface activity than the second surface finish 28. Consequently, portions of the finished metal structures 22 with the first surface finish 26 will have higher pulling strength than portions of the finished metal structures 22 with the second surface finish 28. However, the first surface finish 26 is normally more expensive than the second surface finish 28. For cost and performance considerations, the first surface finish 26 is applied to selective metal structures 24, which are configured to receive important tuning wires or interconnect structures of dies; while the second surface finish 28 is applied to the other metal structures 24, which are configured to receive less important interconnect structures of dies or conductive traces. In different applications, the first and second surface finishes 26 and 28 may be applied to different portions of the metal structures 24.

In one embodiment, the first surface finish 26 may include gold, which has a much higher surface activity compared to copper. One exemplary material used to form the first surface finish 26 is electroless nickel electroless palladium immersion gold (ENEPIG) finish, which includes a first layer 30 formed of gold with a thickness between 0.06 μm and 0.14 μm, a second layer 32 formed of palladium with a thickness between 0.08 μm and 0.16 μm, and a third layer 34 formed of nickel with a thickness between 0.3 μm and 0.5 μm. The third layer 34 resides over the selective metal structures 24, the second layer 32 resides over the third layer 34, and the first layer 30 resides over the second layer 32. The second surface finish 28 does not include gold and may be formed from an organic surface protectorant (OSP) with a thickness between 0.2 μm and 0.4 μm, such as SOLDERITE WPF-207 and COPPERGUARD #177 from Tamura Co. The first surface finish 26 may have a same or different thickness as the second surface finish 28.

As illustrated in FIG. 2B, a first finished metal structure 22-1 includes a first metal structure 24-1, the first surface finish 26 covering a first finish area of the first metal structure 24-1, and the second surface finish 28 covering a second finish area of the first metal structure 24-1. Herein, the first finish area of the first metal structure 24-1 covered by the first surface finish 26 corresponds to one of the first surface finished small pads 22-SP1; and the second finish area of the first metal structure 24-1 covered by the second surface finish 28 corresponds to one of the second surface finished traces 22-T.

In one embodiment, a second finished metal structure 22-2 includes a second metal structure 24-2 and the first surface finish 26 over the second metal structure 24-2, corresponding to one of the first surface finished small pads 22-SP1. A third finished metal structure 22-3 includes a third metal structure 24-3 and the second surface finish 28 over the third metal structure 24-3, corresponding to one of the second surface finished small pads 22-SP2.

Similarly, a fourth finished metal structure 22-4 includes a fourth metal structure 24-4 and the first surface finish 26 over the fourth metal structure 24-4, corresponding to the first surface finished large pad 22-LP1. A fifth finished metal structure 22-5 includes a fifth metal structure 24-5 and the second surface finish 28 over the fifth metal structure 24-5, corresponding to one of the second surface finished small pads 22-SP2 and one of the second surface finished traces 22-T.

Figure 3:
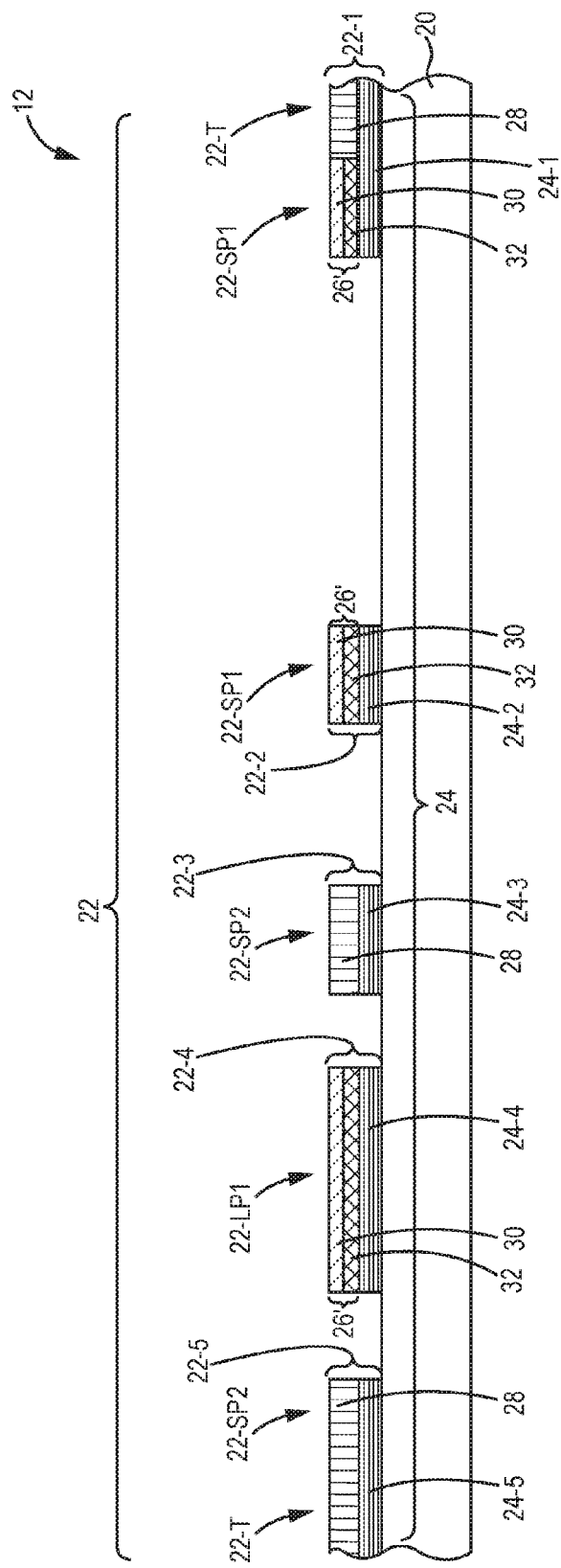
FIG. 3 provides an exemplary substrate structure with selective surface finishes for the exemplary semiconductor package shown in FIG. 1.

In some other applications, electroless palladium immersion gold (EPIG), bussed nickel gold (NiAu), bussless NiAu, or the like may also be used as a first surface finish. As illustrated in FIG. 3, a first surface finish 26' is formed from EPIG, which includes the first layer 30 formed of gold with a thickness between 0.06 μm and 0.14 μm, and the second layer 32 formed of palladium with a thickness between 0.08 μm and 0.16 μm. The second layer 32 resides over the selective metal structures 24, and the first layer 30 resides over the second layer 32.

FIGS. 4A-4G provide exemplary fabrication steps that illustrate a process to fabricate the substrate structure 12 shown in FIG. 2B. Although the exemplary fabrication steps in FIGS. 4A-4G are illustrated in a sequential order, the exemplary fabrication steps are not necessarily order dependent. Some fabrication steps may be done in a different order than that presented. Further, fewer or more fabrication steps may be done than those illustrated in FIGS. 4A-4G.

Initially, the substrate body 20 and the metal structures 24 over the top surface of the substrate body 20 are provided as depicted in FIG. 4A. Then a patterned mask layer 36 is formed over the metal structures 24. In this embodiment, the patterned mask layer 36 covers the second finish area of the first metal structure 24-1, the third metal structure 24-3, and the fifth metal structure 24-5 as depicted in FIG. 4B. The patterned mask layer 36 may be formed of Hitachi PHOTEC Photosensitive Film with a thickness between 19 μm and 25 μm. A lamination process may be used to apply the patterned mask layer 36 over the metal structures 24.

Figure 4D:
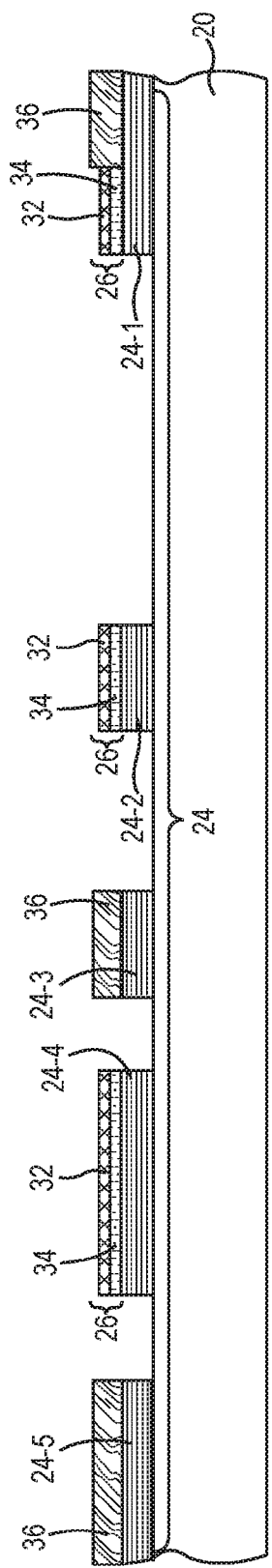
Figure 4E:
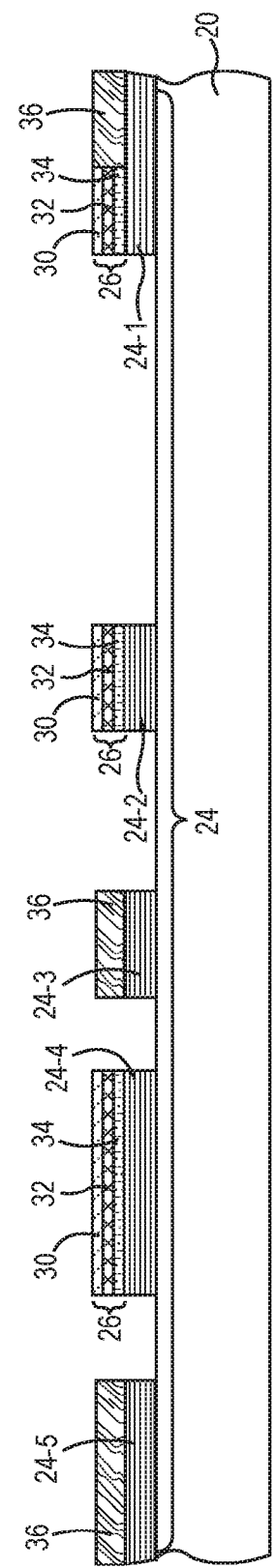

Next, the first surface finish 26 is formed as depicted in FIGS. 4C-4E. The third layer 34 of the first surface finish 26 is formed over portions of the metal structures 24, which are exposed through the patterned mask layer 36. In this embodiment, the third layer 34 of the first surface finish 26 is formed over the first finish area of the first metal structure 24-1, the second metal structure 24-2, and the fourth metal structure 24-4. Then the second layer 32 of the first surface finish 26 is formed over the third layer 34. Finally, the first layer 30 of the first surface finish 26 is formed over the second layer 32 to complete the first surface finish 26. Forming the first surface finish 26 may be provided by an electroless process, which does not require bus bars around the metal structures 24. In one embodiment, the first surface finish 26 is ENEPIG finish, where the first layer 30 formed of gold is provided by an immersion gold bath, the second layer 32 formed of palladium is provided by an electroless palladium bath, and the third layer 34 formed of nickel is provided by an electroless nickel bath. Clearly, if the first surface finish 18 is EPIG finish, a process to form the first surface finish 18 excludes the step to form the third layer 34. Herein, the second layer 32 resides over the portions of the metal structures 24 exposed through the patterned mask layer 36, and the first layer 30 resides over the second layer 32.

Figure 4F:
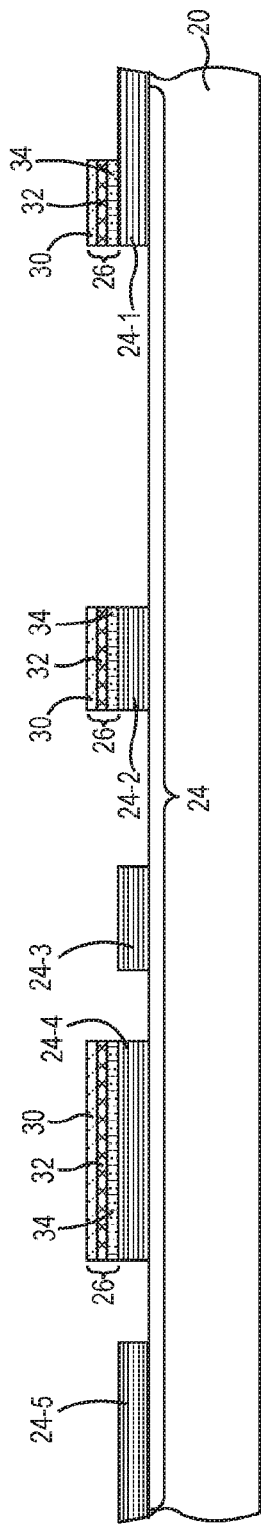
Figure 4G:
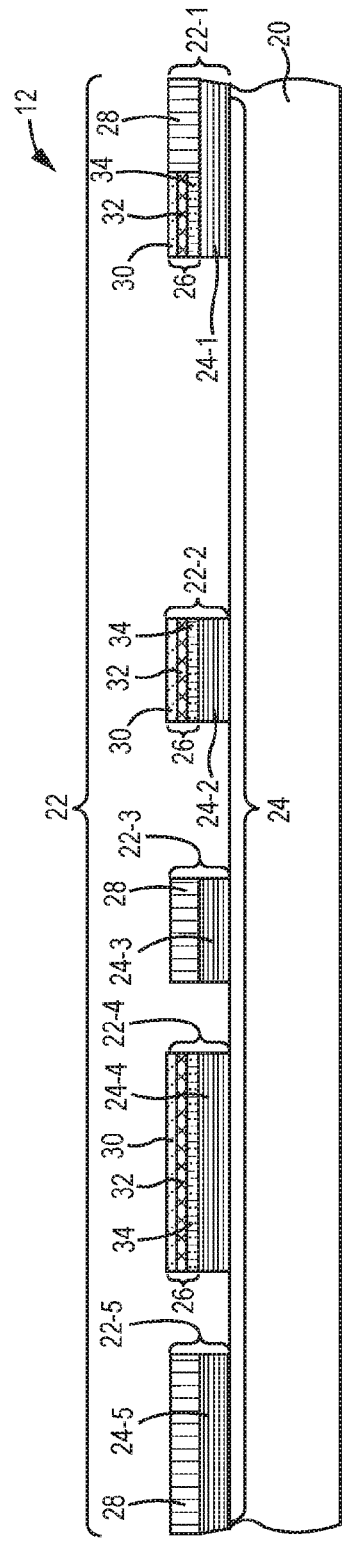

The patterned mask layer 36 is then removed to expose the second finish area of the first metal structure 24-1, the third metal structure 24-3, and the fifth metal structure 24-5 as depicted in FIG. 4F. Removing the patterned mask layer 36 may be provided by a stripping process. Finally, the second surface finish 28 is formed over areas where the patterned mask layer 36 has been removed as depicted in FIG. 4G. In this embodiment, the second surface finish 28 is formed over the second finish area of the first metal structure 24-1, the third metal structure 24-3, and the fifth metal structure 24-5, such that the finished metal structures 22 are completed. The second surface finish 28 may be formed of an OSP and provided by an inline submersion process, which does not require bus bars around the metal structures 24.

Figure 5:
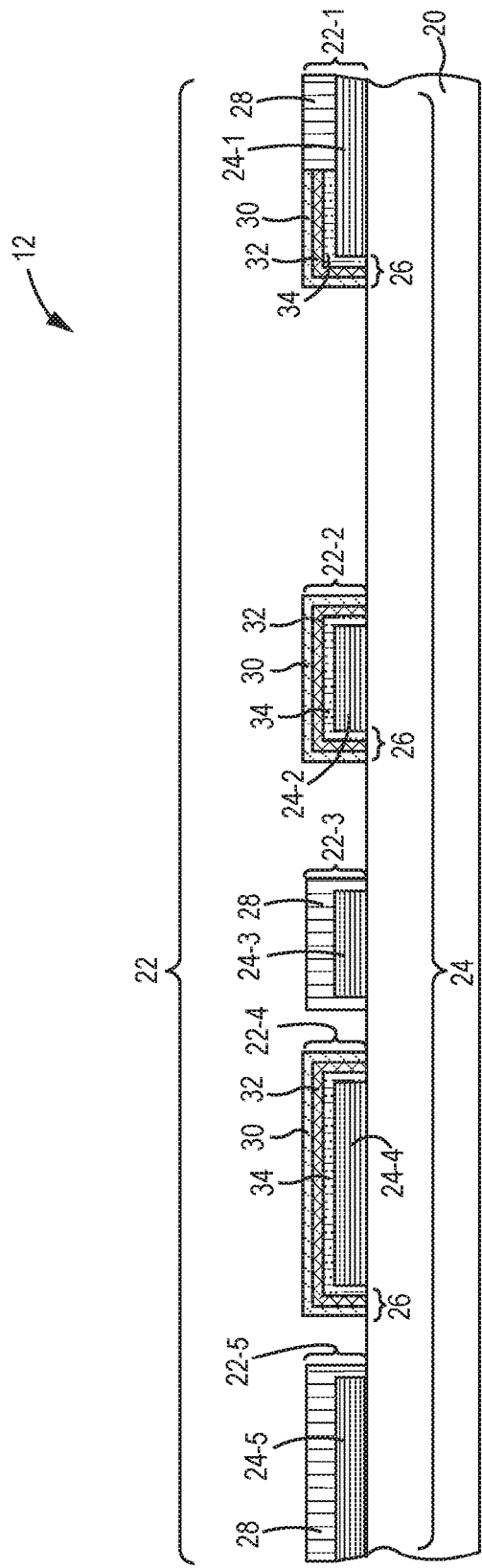
FIG. 5 provides an alternative substrate structure with selective surface finishes according to one embodiment of the present disclosure.

It will be clear to those skilled in the art that it is also possible that the first and second surface finishes 26 and 28 are wrapped around side surfaces of the metal structures 24 as depicted in FIG. 5. Wrapping the first and second surface finishes 26 and 28 around the side surfaces of the metal structures 24 increases active surface areas of the finished metal structures 22, thereby increasing the pulling strength of the finished metal structures 22.

FIGS. 6A-6E provide exemplary fabrication steps that illustrate a process to form the semiconductor package 10 with the substrate structure 12 shown in FIG. 2B. For simplification, only a portion of the substrate structure 12, the first flip chip die 14, and the tuning wire 18 are illustrated. Although the exemplary fabrication steps in FIGS. 6A-6E are illustrated in a sequential order, the exemplary fabrication steps are not necessarily order dependent. Some fabrication steps may be done in a different order than that presented. Further, fewer or more fabrication steps may be done than those illustrated in FIGS. 6A-6E.

After the substrate structure 12 is formed, a flux material 38 is applied to the top surface of the substrate body 20 and encapsulates the finished metal structures 22 as depicted in FIG. 6A. The flux material 38 may be formed from water soluble materials or other similar formulations. The purpose of the flux material 38 is to promote solder liquefying during the later reflowing process. Without the flux material 38, the solders may not properly turn liquid-phase and adhere to any surface. Applying the flux material 38 may be provided by screening, dipping, or other suitable means.

Next, the first flip chip die 14 is placed onto the substrate structure 12 as depicted in FIG. 6B. For the purpose of this illustration, the first flip chip die 14 has a die body 40, a large interconnect structure 42 and two small interconnect structures 44 extending outward from a bottom surface of the die body 40. In different applications, the first flip chip die 14 may include fewer or more interconnect structures.

In detail, the large interconnect structure 42 includes a large solder cap 46 and a large pillar 48 extending outward from the bottom surface of the die body 40 to the large solder cap 46. Each small interconnect structure 44 includes a small solder cap 50 and a small pillar 52 extending outward from the bottom surface of the die body 40 to the small solder cap 50. The large solder cap 46 is coupled to the fourth finished metal structure 22-4 through the flux material 38 and the two small solder caps 50 are coupled to the third and fifth finished metal structures 22-3 and 22-5, respectively, through the flux material 38. Herein, the flux material 38 may encapsulate the large solder cap 46 and the small solder caps 50. The large solder cap 46 is in contact with the first surface finish 26 of the fourth finished metal structure 22-4 and the small solder caps 50 are in contact with the second surface finish 28 of the third and fifth finished metal structures 22-3 and 22-5, respectively. The large and small solder caps 46 and 50 may be formed of tin; and the large and small pillars 48 and 52 may be formed of copper.

As described above, the first surface finish 26 has a higher surface activity than the second surface finish 28, while the first surface finish 26 is more expensive than the second surface finish 28. For cost and performance considerations, the first surface finish 26 may only be applied to selective metal structures 24, which are configured to receive important tuning wires or interconnect structures of a die; while the second surface finish 28 is applied to the remaining metal structures 24, which are configured to receive less important interconnect structures of a die or conductive traces. It will be clear to those skilled in the art that a large solder cap may have a higher probability to flow back to a flip chip die through a pillar than a small solder cap during the reflowing process. Consequently, in this embodiment, the large solder cap 46 is in contact with the first surface finish 26, while the two small solder caps 50 are in contact with the second surface finish 28.

Figure 6C:
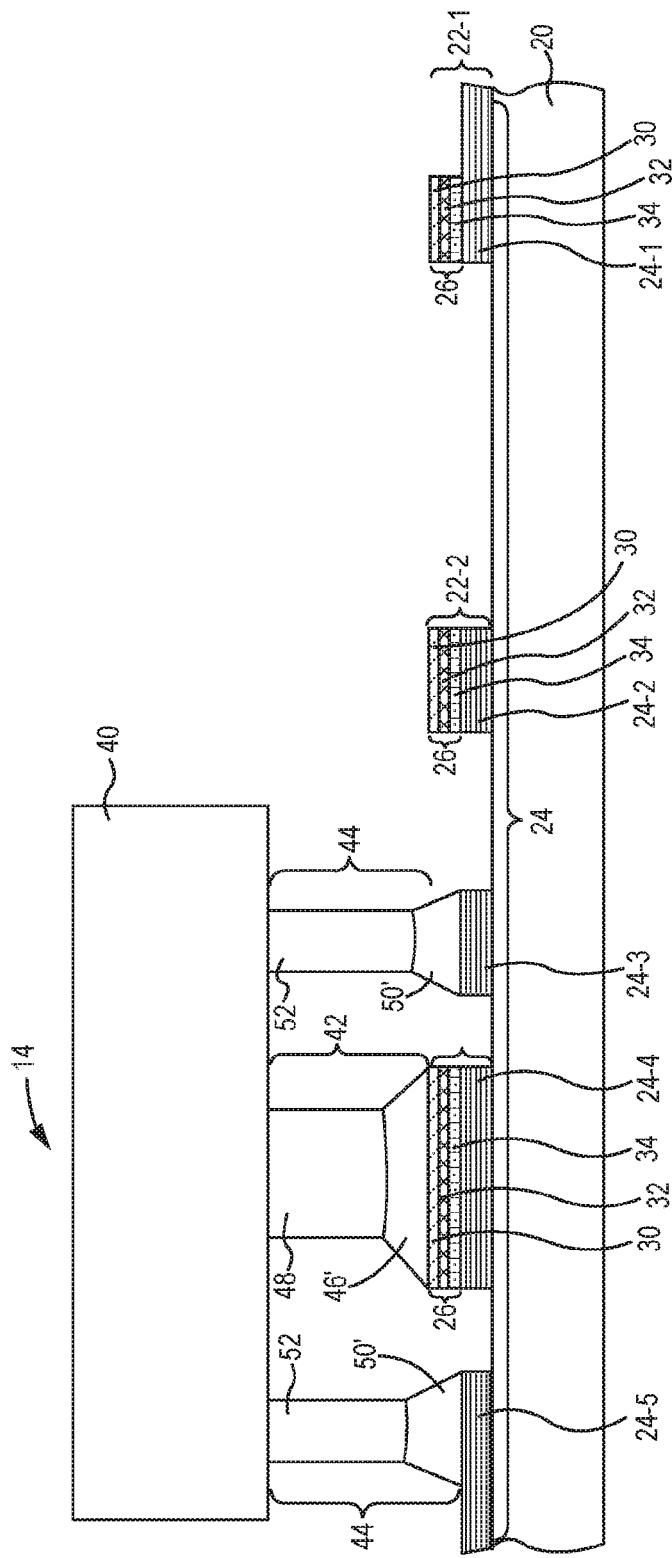

Next, reflowing the large solder cap 46 and the small solder caps 50 within the flux material 38 is followed as depicted in FIG. 6C. During the reflowing process, the large solder cap 46 and the small solder caps 50 turn into a liquid-phase and flow along the most active surfaces. Compared to the large pillar 48, the fourth finished metal structure 22-4 has a higher surface activity due to the first surface finish 26. Thereby, the liquid-phase large solder cap 46 flows along the fourth finished metal structure 22-4 to form a large solder joint 46'. Similarly, compared to the small pillars 50, the third and fifth finished metal structures 22-3 and 22-5 have a higher surface activity due to the second surface finish 28. Thereby, the liquid-phase small solder caps 50 will not flow back to the first flip chip die 14 along the small pillars 52. The reflowing process may be provided by heating in a furnace between 250° C. and 270° C.

Notice that, in applications where the second surface finish 28 is formed of an OSP, the second surface finish 28 is typically consumed during the reflowing process. Small solder joints 50' formed from the small solder caps 50 are directly in contact with the third and fifth metal structures 24-3 and 24-5, respectively. In applications where the second surface finish 28 is formed of a material other than an OSP, the second surface finish 28 may remain after the reflowing process. Further, during the reflowing process, the flux material 38 may burn off substantially. A removal process (not shown) may be applied to remove the residue of the flux material 38 after the reflowing process. The removal process may be provided by a saponifier wash process, which is an aqueous process, or a plasma cleaning process, which is a dry process with an Argon-Oxygen mixed gas.

Figure 6D:
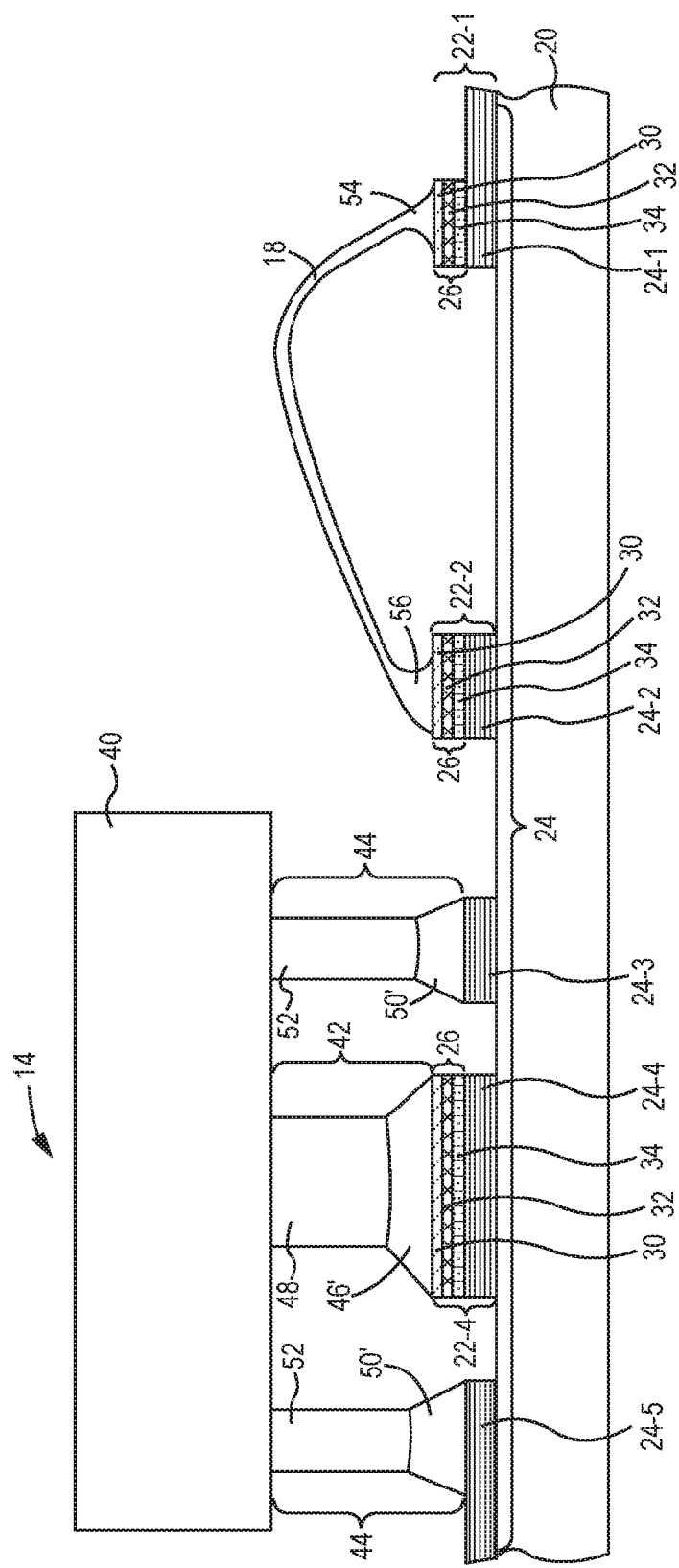

After the reflowing process, the tuning wire 18 is coupled to the substrate structure 12 as depicted in FIG. 6D. Coupling the tuning wire 18 to the substrate structure 12 may be provided by ball bonding or wedge bonding. Herein, the tuning wire 18 has a first end 54 and a second end 56. The first end 54 is coupled to the first finish area of the first finished metal structures 22-1 and in contact with the first surface finish 26 of the first finished metal structures 22-1. The first end 54 may be not in contact with the first metal structure 24-1. The second end 56 is coupled to the second finished metal structures 22-2 and in contact with the first surface finish 26 of the second finished metal structures 22-2. In this embodiment, the tuning wire 18 used as a tuning element may be critical to the performance of the first and second flip chip dies 14 and 16. Therefore, the first and second ends 54 and 56 of the tuning wire 18 are in contact with the first surface finish 26 to achieve reliable wire bonding. The tuning wire 18 may be formed of aluminum, copper, or silver with a diameter between 0.6 mil and 1.0 mil. Note that, the reflowing process occurs between 250° C. and 270° C., which may be high enough to melt the tuning wire 18. Thus, the turning wire 18 is coupled to the substrate structure 12 after the reflowing process.

Figure 6E:
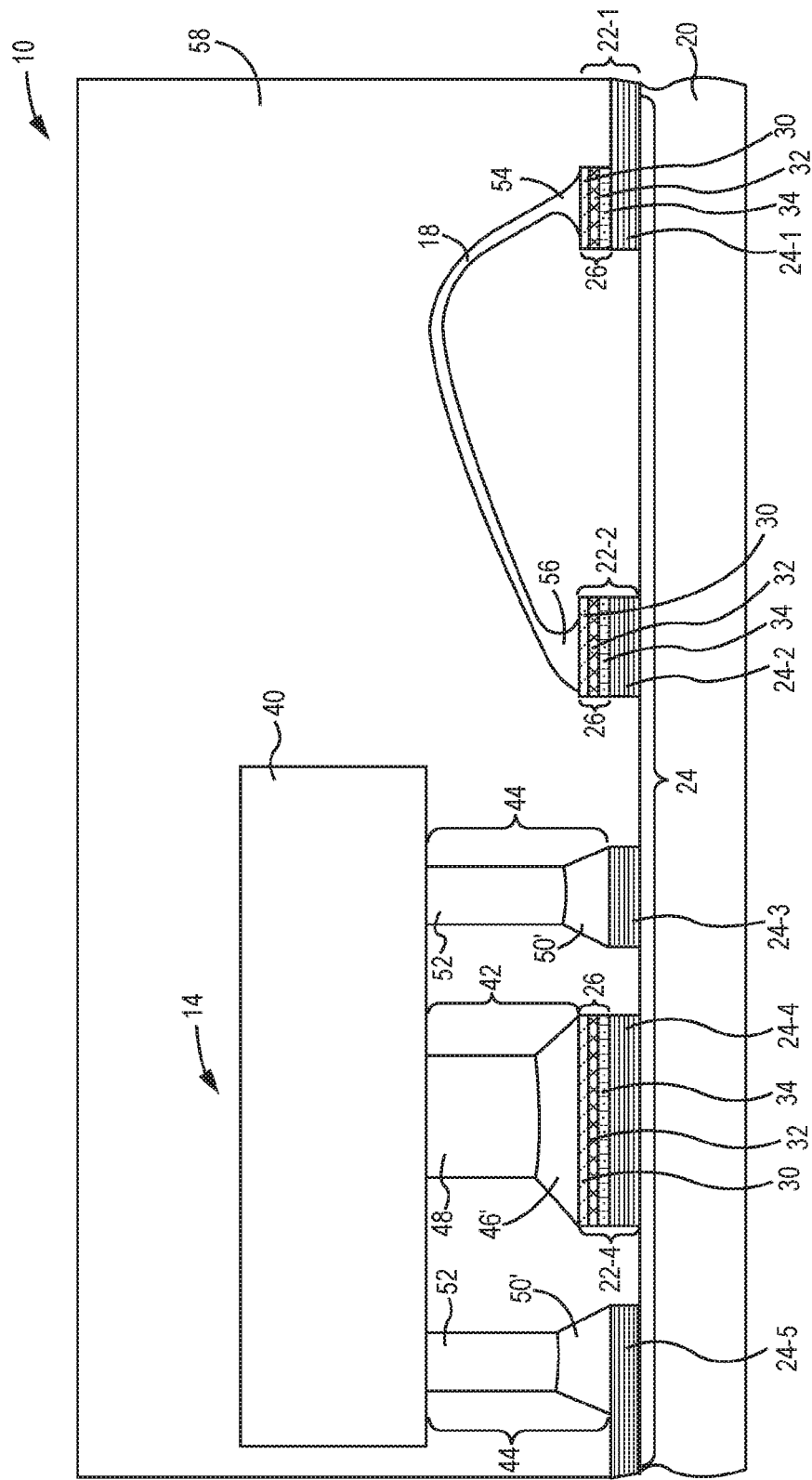

Finally, a mold compound 58 may be formed over the substrate body 20 to form the semiconductor package 10 as depicted in FIG. 6E. The mold compound 58 encapsulates the first flip chip die 14 and the tuning wire 18 to protect them against damages from the outside environment. The mold compound 58 may be applied by various procedures, such as sheet molding, overmolding, compression molding, transfer molding, dam fill encapsulation, and screen print encapsulation. The mold compound 58 is an organic epoxy resin system or the like, such as Hitachi Chemical Electronic Materials GE-100LFC.

Herein, the semiconductor package 10 includes the substrate body 20, the first finished metal structure 22-1, the second finished metal structure 22-2, the third metal structure 24-3, the fourth finished metal structure 22-4, the fifth metal structure 24-5, the flip chip die 14, the tuning wire 18 and the mold compound 58.

In detail, the first finished metal structure 22-1 includes the first surface finish 26 and the first metal structure 24-1 having the first finish area and the second finish area. The first metal structure 24-1 is formed over the substrate body 20, the first surface finish 26 is provided over the first finish area of the first metal structure 24-1, and the first surface finish 26 is not provided over the second finish area of the first metal structure 24-1. The second finish metal structure 22-2 includes the first surface finish 26 and the second metal structure 24-2. The second metal structure 24-2 is formed over the substrate body 20 and the first surface finish 26 is provided over at least a portion of the second metal structure 24-2. The tuning wire 18 is coupled between the first finished metal structure 22-1 and the second finished metal structure 22-2, where the first end 54 is in contact with the first surface finish 26 of the first finished metal structure 22-1 and the second end 56 is in contact with the first surface finish 26 of the second finished metal structure 22-2.

In addition, the third and fifth metal structures 24-3 and 24-5 are formed over the substrate body 20. The fourth finish metal structure 22-4 includes the first surface finish 26 and the fourth metal structure 24-4. The fourth metal structure 24-4 is formed over the substrate body 20 and the first surface finish 26 is provided over at least a portion of the fourth metal structure 24-4. The flip chip die 14 includes the die body 40, the large interconnect structure 42 and the two small interconnect structures 44. The large interconnect structure 42 extends outward from the die body 40 and is in contact with the first surface finish 26 of the fourth finished metal structure 22-4. The two small interconnect structures 44 extend outward from the die body 44 and are in contact with the third and fifth metal structures 24-3 and 24-5, respectively.

Those skilled in the art will recognize improvements and modifications to the embodiments of the present disclosure. All such improvements and modifications are considered within the scope of the concepts disclosed herein and the claims that follow.

What is claimed is:

1. An apparatus comprising:
    a substrate body having a top surface;
    a first finished metal structure comprising a first metal structure that is formed over the top surface of the substrate body and has a first finish area and a second finish area, wherein the first finish area is finished with a first surface finish and the second finish area is not finished with the first surface finish;
    a second finished metal structure comprising a second metal structure that is formed over the top surface of the substrate body and has a third finish area, wherein at least one portion of the third finish area is finished with the first surface finish;
    a third finished metal structure comprising a third metal structure that is formed over the top surface of the substrate body and has a fourth finish area, wherein at least one portion of the fourth finish area is finished with the first surface finish;
    a tuning wire coupled between the first finish area and the at least one portion of the third finish area; and
    a flip chip die having a die body and a first interconnect structure, wherein the first interconnect structure extends outward from the die body and is coupled to the at least one portion of the fourth finish area.

2. The apparatus of claim 1 wherein the first surface finish is electroless nickel electroless palladium immersion gold (ENEPIG).

3. The apparatus of claim 2 wherein the first surface finish comprises:
    a first layer formed of gold with a thickness between 0.06 μm and 0.14 μm;
    a second layer formed of palladium with a thickness between 0.08 μm and 0.16 μm; and
    a third layer formed of nickel with a thickness between 0.3 μm and 0.5 μm, wherein the third layer is over the first finish area, the second layer is over the third layer, and the first layer is over the second layer.

4. The apparatus of claim 1 wherein the first surface finish is of one of a group consisting of electroless palladium immersion gold (EPIG), bussless nickel gold, and electroless nickel.

5. The apparatus of claim 1 wherein the second surface area is finished with a second surface finish that has a different surface activity compared to the first surface finish.

6. The apparatus of claim 1 wherein the first surface area corresponds to a pad and the second surface area corresponds to a conductive trace that connects the pad to another pad or via.

7. The apparatus of claim 1 wherein the first surface finish is a multilayer finish.

8. The apparatus of claim 1 wherein the first metal structure and the second metal structure are formed of copper.

9. The apparatus of claim 1 further comprising a fourth metal structure formed over the top surface of the substrate body and the flip chip die further comprising a second interconnect structure, wherein the second interconnect structure extends outward from the die body and is coupled to the fourth metal structure.

10. A method comprising:
    providing a substrate body with a first metal structure, a second metal structure and a third metal structure formed on a top surface of the substrate body, wherein the first metal structure has a first finish area and a second finish area, the second metal structure has a third finish area, and the third metal structure has a fourth finish area;
    forming a first surface finish over the first finish area, at least one portion of the third finish area, and at least one portion of the fourth finish area;
    forming a second surface finish over the second finish area, wherein the second surface finish has different surface activity compared to the first surface finish;
    applying a flux material to the top surface of the substrate body;
    coupling a tuning wire between the first finish area and the at least one portion of the third finish area; and
    coupling a flip chip die to the at least one portion of the fourth finish area.

11. The method of claim 10 wherein coupling the tuning wire between the first finish area and the at least one portion of the third finish area is provided by ball bonding or wedge bonding.

12. The method of claim 10 wherein the first surface finish comprises gold and the second surface finish does not comprise gold.

13. The method of claim 10 wherein the first surface finish is ENEPIG, which has a first layer formed of gold, a second layer formed of palladium, and a third layer formed of nickel.

14. The method of claim 13 wherein forming the first surface finish comprises:
    forming the third layer over the first finish area and the at least one portion of the third finish area by an electroless nickel bath;
    forming the second layer over the third layer by an electroless palladium bath; and
    forming the first layer over the second layer by an immersion gold bath.

15. The method of claim 10 wherein the second surface finish is an organic surface protectorant (OSP).

16. The method of claim 15 wherein the second surface finish is provided by an inline submersion process.

17. The method of claim 10 wherein the flip chip die has a die body, a solder cap and a pillar extending outward from the die body to the solder cap, and wherein coupling the flip chip die to the at least one portion of the fourth finish area comprises:

placing the solder cap in contact with the first surface finish on the at least one portion of the fourth finish area; and reflowing the solder cap, such that the solder cap forms a solder joint in contact with the first surface finish on the at least one portion of the fourth finish area.

* * * * *